US008705289B2

(12) United States Patent  
Yang et al.

(10) Patent No.: US 8,705,289 B2  
(45) Date of Patent: Apr. 22, 2014

(54) FLASH MEMORY APPARATUS WITH PROGRAMMING VOLTAGE CONTROL GENERATORS

(75) Inventors: Ching-Sung Yang, Hsinchu (TW); Wen-Hao Ching, Hsinchu (TW); Wei-Ming Ku, New Taipei (TW); Yung-Hsiang Chen, Hsinchu (TW); Shih-Chen Wang, Taipei (TW); Hsin-Ming Chen, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 127 days.

(21) Appl. No.: 13/344,621

(22) Filed: Jan. 6, 2012

(65) Prior Publication Data

US 2013/0176793 A1 Jul. 11, 2013

Related U.S. Application Data

(60) Provisional application No. 61/513,678, filed on Aug. 1, 2011.

(51) Int. Cl.
 *G11C 16/06* (2006.01)
(52) U.S. Cl.
 USPC ............... 365/185.25; 365/182; 365/185.18; 365/185.28
(58) Field of Classification Search
 CPC ....... G11C 16/08; G11C 16/12; G11C 16/107
 USPC .................. 365/182, 185.18, 185.25, 185.28, 365/185.29
 See application file for complete search history.

(56) References Cited

U.S. PATENT DOCUMENTS

| 5,774,392 | A * | 6/1998 | Kraus et al. ............. 365/145 |
| 7,508,703 | B2 | 3/2009 | Mokhlesi |
| 7,508,710 | B2 | 3/2009 | Mokhlesi |
| 2008/0111532 | A1* | 5/2008 | Tran et al. .............. 323/313 |
| 2008/0266944 | A1* | 10/2008 | Chen et al. ............. 365/174 |
| 2012/0134228 | A1* | 5/2012 | Yu et al. ................ 365/226 |

FOREIGN PATENT DOCUMENTS

| JP | H01282796 | 11/1989 |
| JP | H10334678 | 12/1998 |
| JP | 2000057793 | 2/2000 |
| JP | 2008112507 | 5/2008 |
| JP | 2009117018 | 5/2009 |
| JP | 2011018443 | 1/2011 |

OTHER PUBLICATIONS

"Office Action of Japan Counterpart Application", issued on May 14, 2013, p. 1-p. 2, in which the listed references were cited.

* cited by examiner

*Primary Examiner* — Hoai V Ho  
(74) *Attorney, Agent, or Firm* — Jianq Chyun IP Office

(57) ABSTRACT

A flash memory apparatus is provided. The flash memory apparatus includes a plurality of memory cells and a plurality of programming voltage control generators. Each of the memory cells receives a programming control voltage through a control end thereof, and executes data programming operation according to the programming control voltages. Each of the programming voltage control generators includes a pre-charge voltage transmitter and a pumping capacitor. The pre-charge voltage transmitter provides pre-charge voltage to the end of each of the corresponding memory cells according to pre-charge enable signal during a first period. A pumping voltage is provided to the pumping capacitor during a second period, and the programming control voltage is generated at the control end of each of the memory cells.

21 Claims, 8 Drawing Sheets

FLASH MEMORY APPARATUS WITH PROGRAMMING VOLTAGE CONTROL GENERATORS

CROSS-REFERENCE TO RELATED APPLICATION

This application claims the priority benefit of U.S. Provisional application Ser. No. 61/513,678, filed on Aug. 1, 2011. The entirety of the above-mentioned patent application is hereby incorporated by reference herein and made a part of specification.

BACKGROUND OF THE INVENTION

1. Field of the Invention

The invention generally relates to a flash memory apparatus, in particular, to a flash memory apparatus with a voltage boost circuit.

2. Description of Related Art

Nowadays, memories could be classified into volatile memories and non-volatile memories. A volatile memory, for example, a dynamic random access memory (DRAM) has an advantage of fast programming and reading. Nevertheless, the volatile memory only operates when power is applied to the flash memory. On the other hand, although a non-volatile memory e.g. a flash memory operates slowly while programming and reading, the flash memory retains information inside for a long time even when there is no power applied to the flash memory.

Generally for operation of a flash memory, while programming or erasing, a specific voltage is required for injecting charges into the floating gate of the flash memory or drawing charges out of the floating gate of the flash memory. Therefore, a charge-pump circuit or a voltage generation circuit is usually needed for operating the flash memory. Hence, the voltage generation circuit of the flash memory circuit plays an important role in the operation of the flash memory.

SUMMARY OF THE INVENTION

Accordingly, the present invention is directed to a flash memory apparatus, and further to a flash memory with low operation voltage and low power consumption.

The present invention is directed to a flash memory apparatus. The flash memory apparatus includes a plurality of memory cells and a plurality of programming control voltage generators wherein each of memory cells receives a programming control voltage through a control end point and executes data programming operation according to the programming control voltage. The programming control voltage generators are respectively coupled to the memory cells. Each of the programming control voltage generators includes a pre-charge voltage transmitter and a pumping capacitor. The pre-charge voltage transmitter is coupled to the control end point of each of the memory cells. The pre-charge voltage transmitter applies the pre-charge voltage to the control end point of the corresponding memory cell according to a pre-charge enable signal during a first period of time. Besides, the pumping capacitor is coupled between the control end point of each of the memory cells and a pumping voltage. The pumping voltage is applied to the pumping capacitor during a second period of time, and generates the programming control voltage for programming at the control end points of the memory cells.

According to an embodiment of the present invention, the flash memory apparatus further includes a plurality of erasing control voltage generators. Each of the erasing control voltage generators includes an erasing pre-charge voltage transmitter and an erasing pumping capacitor. The erasing pre-charge voltage transmitter is coupled to the erase end point of each of the memory cells. The erasing pre-charge voltage transmitter applies an erasing pre-charge voltage to the erase end point of the corresponding memory cell according to an erasing pre-charge enable signal during a third period of time. The erasing pumping capacitor is coupled between the erase end point of each of the memory cells and an erasing pumping voltage. The erasing pumping voltage is applied to the erasing pumping capacitor during a fourth period of time, and generates an erasing control voltage for erasing at the erase end points of the memory cells.

As described above, the present invention provides a flash memory apparatus. The flash memory apparatus transmits outside pre-charge voltages to the control or erase end points of the memory cells through pre-charge voltage transmitters, and boosts the pre-charge voltages received by the control or erase end points of the memory cells to the programming or erasing control voltages for operating the flash memory apparatus. The pre-charge voltages applied from the exterior of the apparatus will be lowered and the power consumption that the exterior of the apparatus supplying the pre-charge voltages will be reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
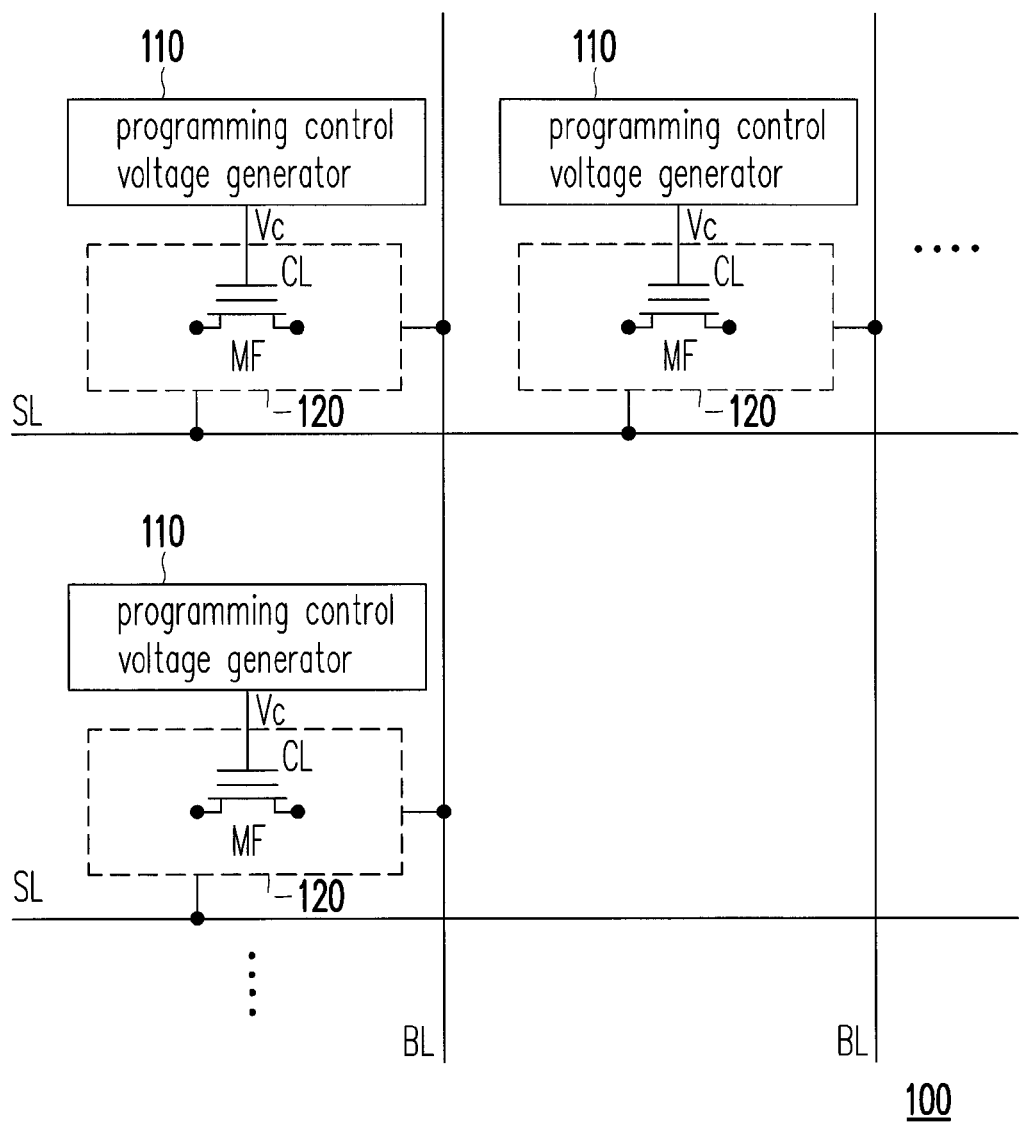
FIG. 1A shows a schematic view of the flash memory apparatus according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1A shows a schematic view of a flash memory apparatus 100 according to an embodiment of the invention. Please refer to FIG. 1A. The flash memory apparatus 100 includes a plurality of memory cells 120 and a plurality of programming control voltage generators 110. The memory cells 120 are arranged in order of array, and the programming control voltage generators 110 are respectively coupled to control end points CL of the memory cells 120. Generally speaking, the memory cells 120 of the flash memory apparatus 100 include MF, such as stacked-gate floating-gate transistors, single-poly floating-gate transistors or dielectric storage transistors. The two ends of each of the memory cells 120 are respectively coupled to a source line SL and a bit line BL. The memory cells 120 receive programming control voltages Vc generated by the programming control voltage generators 110 respectively to execute data programming operation through the control end points CL thereof.

Figure 1B:
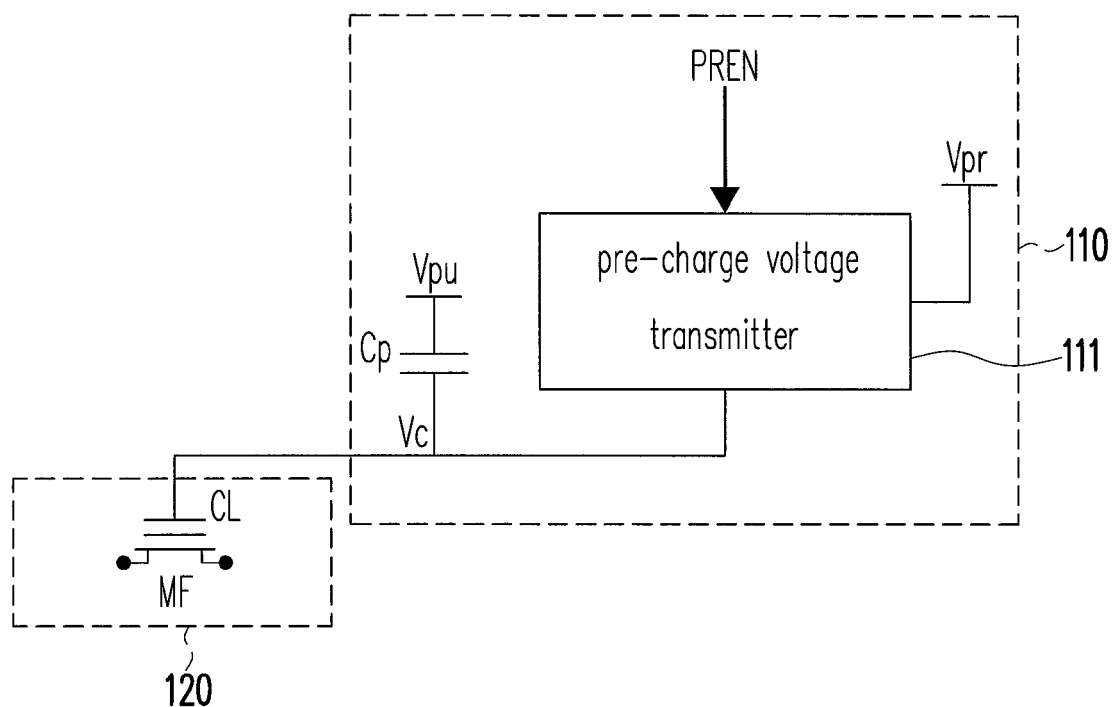
FIG. 1B shows a schematic view of the programming control voltage generator.

FIG. 1B shows a schematic view of the programming control voltage generator 110. Please refer to FIG. 1B. The programming control voltage generator 110 includes a pre-charge voltage transmitter 111 and a pumping capacitor Cp. Wherein, the pre-charge voltage transmitter 111 is coupled to the control end point CL of the corresponding memory cell 120. About the operation of the pre-charge voltage transmitter 111, firstly, a pre-charge enable signal PREN is applied to the pre-charge voltage transmitter 111 in a first period of time, and the pre-charge voltage transmitter 111 is turned on correspondingly. Meanwhile, a pre-charge voltage Vpr is applied to the control end point CL of the corresponding memory cell 120 through the turned-on pre-charge voltage transmitter 111. In the mean time, the value of the programming control voltage Vc is approximately equal to the value of the pre-charge voltage Vpr. On the other hand, a pumping capacitor Cp is coupled between the control end point CL of the corresponding memory cell 120 and a pumping voltage Vpu. After the first period of time, the pumping voltage Vpu is applied to the end of the pumping capacitor Cp which is not coupled to the end of the pre-charge voltage transmitter 111 during a second period of time. Thus, the programming control voltage Vc is boosted at the control end point CL of the corresponding memory cell 120. Practically, the value of the programming control voltage Vc is approximately equal to the sum of the value of the pumping voltage Vpu and the value of pre-charge voltage Vpr.

Figure 2A:
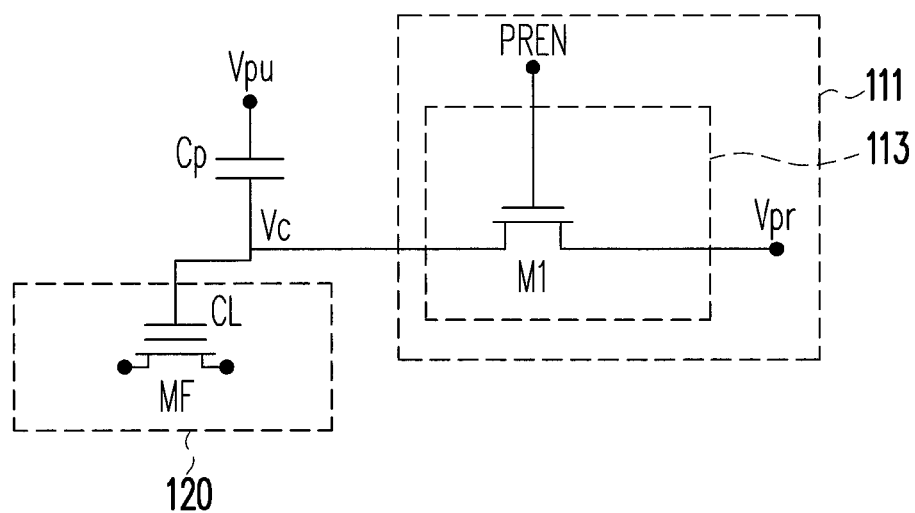
FIG. 2A shows a schematic view of the implementation of the pre-charge voltage transmitter according to an embodiment of the invention.

Then, please refer to FIG. 2A. FIG. 2A shows a schematic view of the implementation of the pre-charge voltage transmitter 111 according to an embodiment of the invention. In this embodiment, the pre-charge voltage transmitter 111 includes a pre-charge programming switch 113 which is constructed of a transistor M1. The pre-charge programming switch 113 has a first end, a second end, and a control end. The first end of the pre-charge programming switch 113 is coupled to the control end point CL of the corresponding memory cell 120, and the second end of the pre-charge programming switch 113 receives the pre-charge voltage Vpr, and the control end of the pre-charge programming switch 113 receives the pre-charge enable signal PREN.

Figure 2B:
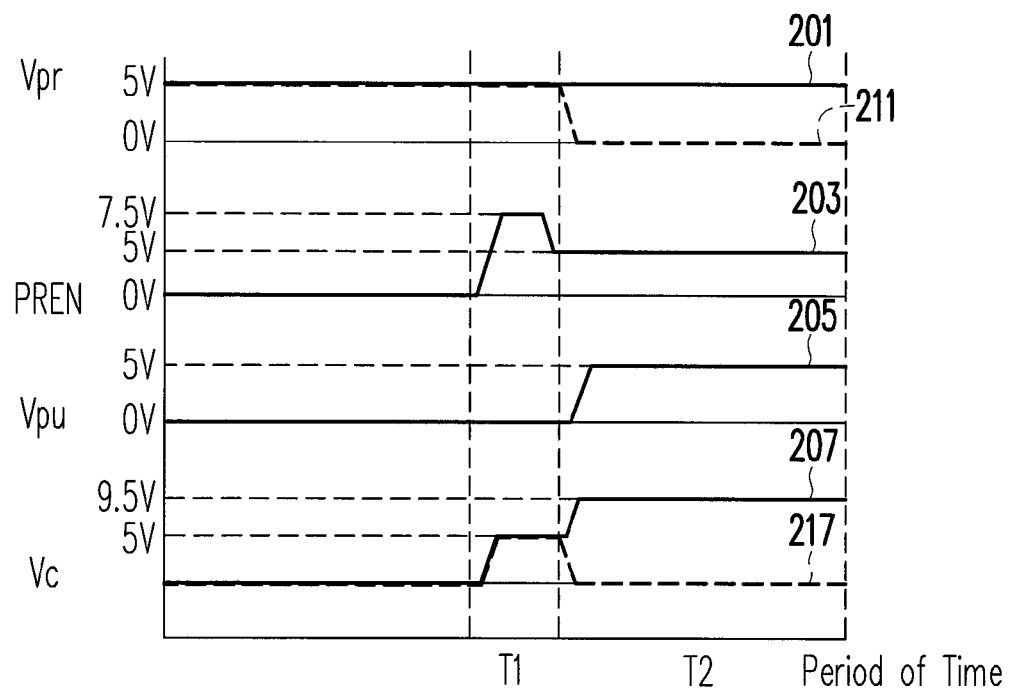
FIG. 2B shows a behavior waveform of the pre-charge voltage transmitter according to an embodiment of the invention.

For the further explanation, please refer to FIG. 2A and FIG. 2B. FIG. 2B shows an application waveform according to an embodiment of the invention. In this embodiment, the application waveform describes how the plurality of programming control voltage generators 110 execute a selective data programming and data erasing operation in the same time. When charging the control end point CL, please refer to the curves 201, 203, 205 and 207 in FIG. 2B. During a period of time T1, the second end of the transistor M1 receives the pre-charge voltage Vpr e.g. 5 Volts (curve 201). Besides, the pre-charge enable signal PREN received by the control end of the transistor M1 is biased to e.g. 7.5 volts (curve 203) and the transistor M1 is turned on correspondingly. At this time, the initial value of the pumping voltage Vpu is e.g. 0 volts (curve 205) and the pre-charge voltage Vpr is transmitted to the control end point CL of the corresponding memory cell 120, and the value of the programming control voltage Vc is equal to the value of pre-charge voltage Vpr (curve 207). Then, during a period of time T2, the pumping voltage Vpu is biased to e.g. 5 volts (curve 205) and the programming control voltage Vc is boosted to the value e.g. 9.5 volts (curve 207) which is approximately equal to the sum of the pre-charge voltage Vpr and the pumping voltage Vpu. Then, the memory cell 120 can be executed data programming operation.

According to another embodiment of the invention, when discharging the control end point CL, please refer to the curves 203, 205, 211 and 217. In this embodiment, the pre-charge enable signal PREN and the pumping voltage Vpu behave the same as the curve 203 and 205 of the embodiment as described above. Besides, during the period of time T1, transistor M1 receives the pre-charge voltage Vpr e.g. 5 Volts (curve 211) and the value of the programming control voltage Vc is equal to the value of pre-charge voltage Vpr (curve 217). During the period of time T2, the pre-charge voltage Vpr is driven down to e.g. 0 volts (curve 211) and the programming control voltage Vc discharged to e.g. 0 volts (curve 217). Then, the memory cell 120 may be executed data erasing operation.

It is noteworthy that the level of the pre-charge enable signal PREN may be driven down a bit to the value of the pre-charge voltage before entering the period T2, for example, from 7.5 volts to 5 volts (curve 203). At this time, the transistor M1 is cut-off, regarded as a diode, and the diode is reverse biased between the pre-charge voltage Vpr and the programming control voltage Vc. Such as that, when the programming control voltage Vc is boosted during the period T2, the pre-charge voltage Vpr does not effect the boost of the programming control voltage Vc.

Figure 2C:
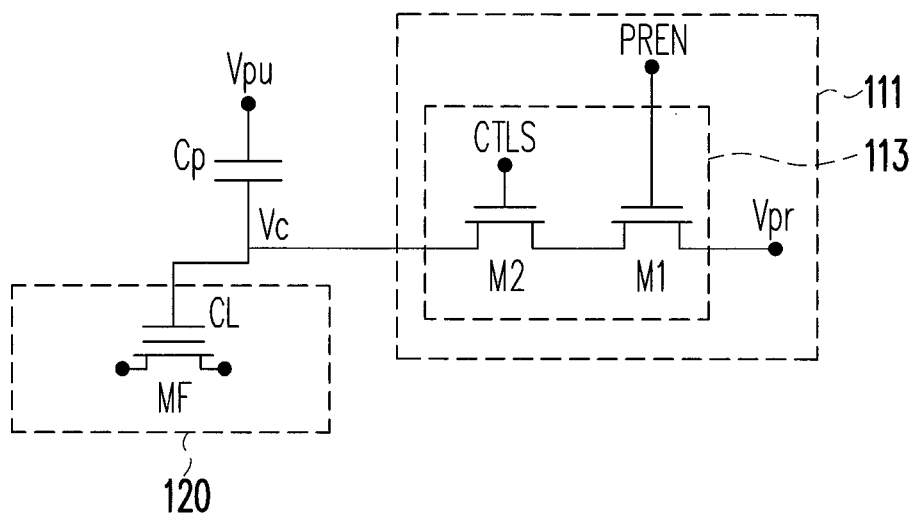
FIG. 2C shows another implementation of the pre-charge voltage transmitter according to an embodiment of the invention.

FIG. 2C shows another implementation of the pre-charge voltage transmitter 111 according to an embodiment of the invention. Please refer to FIG. 2C. Dissimilarly, in this embodiment, the pre-charge programming switch 113 of the pre-charge voltage transmitter 111 further includes a transistor M2 and a transistor M1. The transistors M1 and M2 respectively have a first end, a second end, and a control end. The transistor M2 is coupled to the transistor M1 in series, and the transistor M2 is coupled on the path which the transistor M1 is coupled to the control end point CL of the corresponding memory cell 120. More specifically, the first end of the transistor M2 is coupled to the control end point CL of the corresponding memory cell 120, and the second end of the transistor M2 is coupled to the first end of the transistor M1, and the control end of the transistor M2 receives a control signal CTLS. Thus, the voltage difference between the programming control voltage Vc and the pre-charge voltage Vpr is shared by the transistor M1 and the transistor M2 through the serial connection between the transistor M1 and the transistor M2.

Figure 3A:
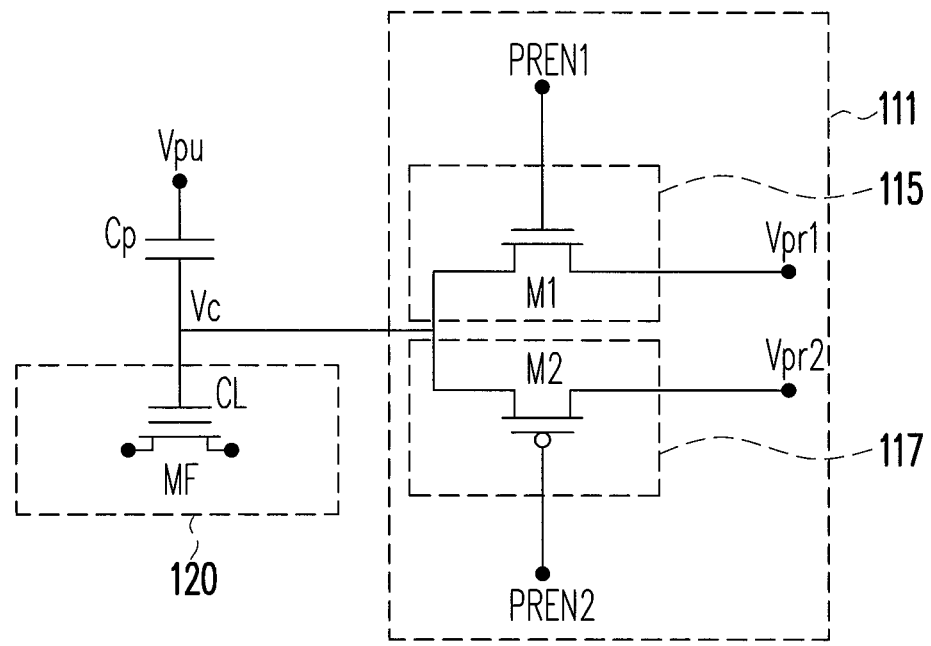
FIG. 3A shows another schematic view of the implementation of the pre-charge voltage transmitter according to an embodiment of the invention.

Please refer to FIG. 3A, FIG. 3A shows another schematic view of the implementation of the pre-charge voltage transmitter 111 according to an embodiment of the invention. In this embodiment, the pre-charge voltage transmitter 111 includes a pre-charge programming switch 115 and a pre-charge programming switch 117. The pre-charge programming switch 115 is coupled between a first pre-charge voltage Vpr1 and the control end point CL of the corresponding memory cell 120, and the pre-charge programming switch 117 is coupled between a second pre-charge voltage Vpr2 and the control end point CL of the corresponding memory cell 120. The pre-charge programming switches 115 and 117 respectively include a transistor M1 and a transistor M2. The transistor M1 is coupled between the first pre-charge voltage Vpr1 and the control end point CL of the corresponding memory cell 120, and the transistor M2 is coupled between the second pre-charge voltage Vpr2 and the control end point CL of the corresponding memory cell 120. The first or second pre-charge voltage Vpr1 or Vpr2 is transmitted to the corresponding memory cell 120 according to a first pre-charge enable voltage PREN1 or a second pre-charge enable voltage PREN2.

Please note that, in this embodiment, the pre-charge programming switch 115 or the pre-charge programming switch 117 transmits a respectively different pre-charge voltage i.e. the first or the second pre-charge voltage Vpr1 or Vpr2 to correspond with different requirements of voltages. For example, when executing the data programming operation, the second pre-charge voltage Vpr2 for programming can be applied through the pre-charge programming switch 117 such as 5 volts. On the other hand, when executing a different operation (e.g. reading operation), the first pre-charge voltage Vpr1 can be applied through the pre-charge programming switch 115 such as 0 volts. Thus, different voltages are transmitted to their control end points CL of the corresponding memory cells 120 through different switches.

Figure 3B:
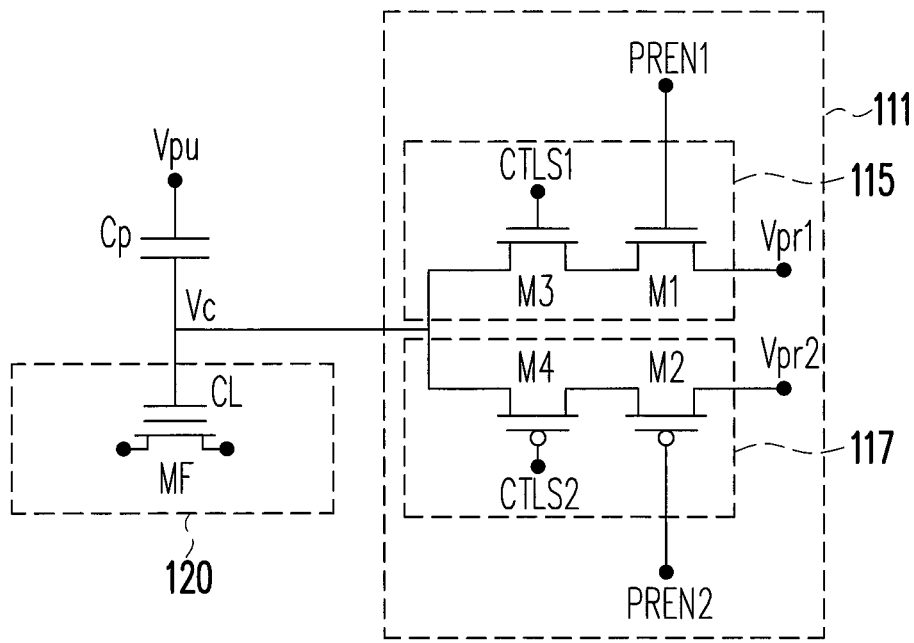
FIG. 3B shows another schematic view of the implementation of the pre-charge voltage transmitter according to an embodiment of the invention.

Please refer to FIG. 3B. FIG. 3B shows another schematic view of the implementation of the pre-charge voltage transmitter 111 includes pre-charge programming switches 115 and 117 according to an embodiment of the invention. The pre-charge programming switch 115 and 117 of the embodiment may be implemented with the serial connection of two transistors. The pre-charge programming switch 115 includes a transistor M1 and a transistor M3 which are coupled in series between the first pre-charge voltage Vpr1 and the control end point CL of the corresponding memory cell 120. Similarly, the pre-charge programming switch 117 includes a transistor M2 and a transistor M4 which are coupled in series between the second pre-charge voltage Vpr2 and the control end point CL of the corresponding memory cell 120. Alternatively, in this embodiment, the first pre-charge voltage Vpr1 can be transmitted to the control end point CL of the corresponding memory cell 120 by applying the first pre-charge enable signal PREN1 to the control end of transistor M1 and applying a first control signal CTLS1 to the control end of the transistor M3, or the second pre-charge voltage Vpr2 can be transmitted to the control end point CL of the corresponding memory cell 120 by applying the second pre-charge enable signal PREN2 to the control end of transistor M2 and applying a second control signal CTLS2 to the control end of the transistor M4.

It is noteworthy that, in this embodiment, the transistor M1 and M3 of the pre-charge programming switch 115 could be N-type transistors. Comparatively, the transistor M2 and M4 of the pre-charge programming switch 117 could be P-type transistors. The P-type transistors are adapted to transmit high voltage such as 5 volts, and the N-type transistors are adapted to transmit low voltage such as 0 volts. Thus, the pre-charge voltage transmitter 111 of this embodiment is fit to operate a flash memory to transmit wide range of voltages.

Figure 4:
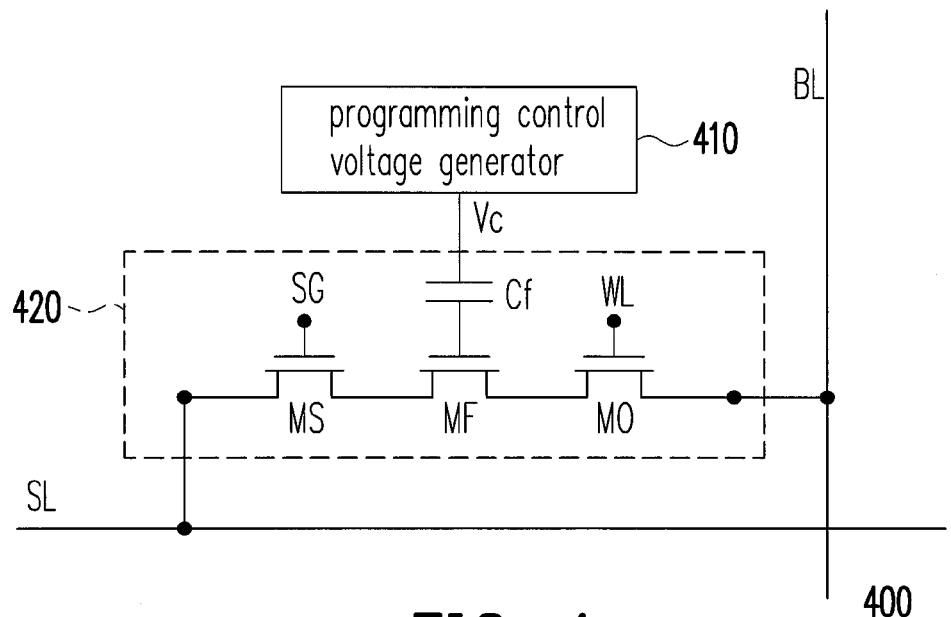
FIG. 4 shows another schematic view of the flash memory apparatus according to an embodiment of the invention.

FIG. 4 shows another schematic view of a flash memory apparatus 400 according to an embodiment of the invention. Please refer to FIG. 4. The flash memory apparatus 400 includes a plurality of memory cells 420 and a plurality of programming control voltage generators 410. Each of the memory cells 420 coupled between a source line SL and a bit line BL includes a single-poly floating-gate transistor MF, a selecting transistor MS, an operation transistor MO, and a gate capacitor Cf. The single-poly floating-gate transistor MF, the selecting transistor MS, and the operation transistor MO respectively have a first end, a second end, and a control end. The first end of the single-poly floating-gate transistor MF is coupled to the source line. The second end of the single-poly floating-gate transistor MF is coupled to the bit line BL, and the control end of the single-poly floating-gate transistor MF receives the programming control voltage Vc for operating. The selecting transistor MS is coupled on the path where the source line SL is coupled to the single-poly floating-gate transistor MF. More specifically, the first end of the selecting transistor MS is coupled to the source line SL, and the second end of the selecting transistor MS is coupled to the first end of the single-poly floating-gate transistor MF, and the control end of the selecting transistor MS receives a selecting signal SG. The operation transistor MO is coupled on the path where the bit line BL is coupled to the single-poly floating-gate transistor MF. More specifically, the first end of the operation transistor MO is coupled to the second end of the single-poly floating-gate transistor MF, and the second end of the operation transistor MO is coupled to the bit line BL, and the control end of the operation transistor is coupled to the word line enable signal WL. In addition, the gate capacitor Cf is coupled between the programming control voltage Vc and the control end of the single-poly floating-gate transistor MF.

Figure 5A:
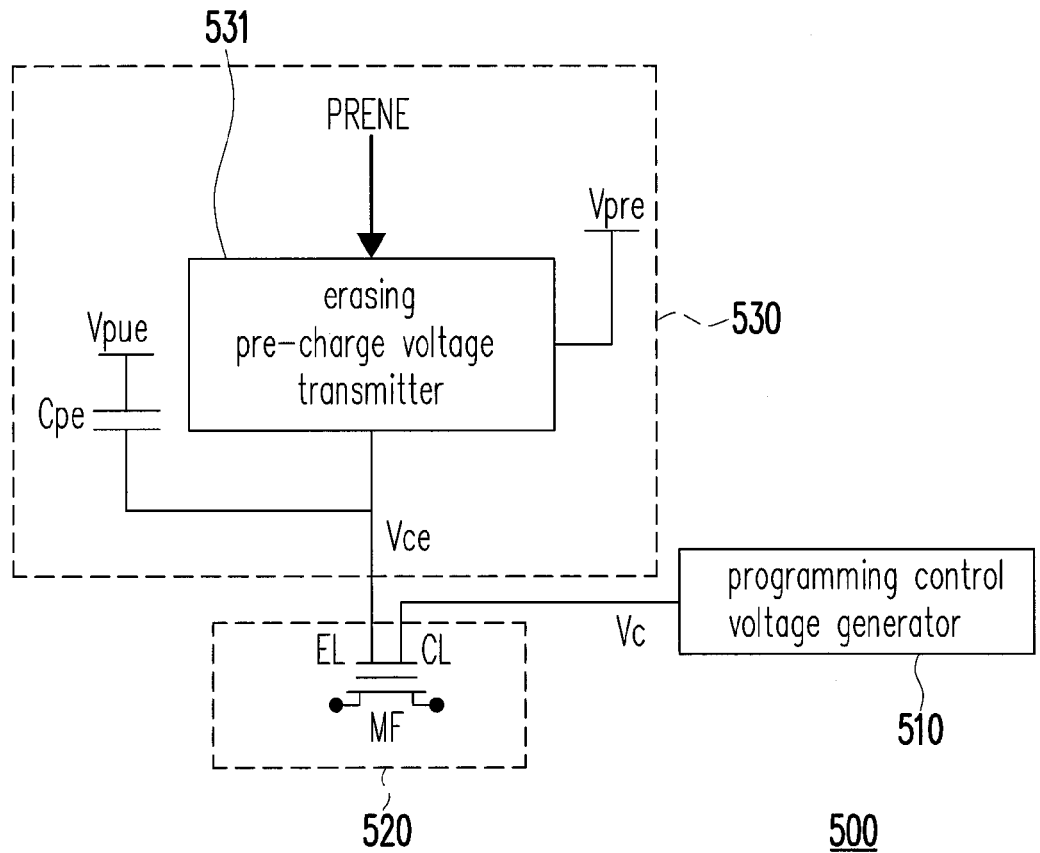
FIG. 5A shows another partial schematic view of the flash memory apparatus 500 according to an embodiment of the invention.

FIG. 5A shows another partial schematic view of a flash memory apparatus 500 according to an embodiment of the invention. Please refer to FIG. 5A. In addition to data programming operation, the flash memory apparatus 500 also requires a voltage generation circuit to perform a data erasing operation. Therefore, in the flash memory apparatus 500 of the embodiment, an erase end point EL is coupled to an erasing control voltage generator 530, and an erasing pre-charge voltage Vpre is transmitted to the erase end point EL of a memory cell 520 according to an erasing pre-charge enable signal PRENE. Then, an erasing control voltage Vice for erasing is generated according to an erasing pumping voltage Vpue which is applied to an erasing pumping capacitor Cpe. Wherein, the memory cell 520 includes a MF, such as a stacked-gate floating-gate transistor, a single-poly floating-gate transistor or a dielectric storage transistor.

Figure 5B:
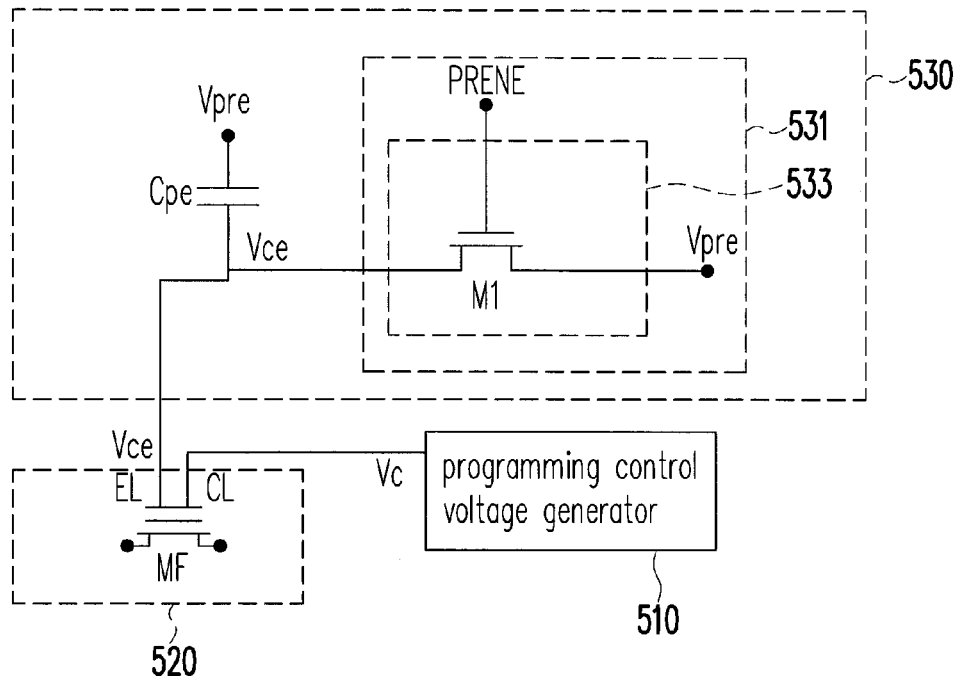
FIG. 5B~FIG. 5E show different schematic views of the implementations of the erasing pre-charge voltage transmitter according to embodiments of the invention.

FIG. 5B shows a schematic view of an erasing pre-charge voltage transmitter 531 according to an embodiment of the invention. Please refer to FIG. 5B. The erasing pre-charge voltage transmitter 531 includes an erasing pre-charge switch 533. In this embodiment, the erasing pre-charge switch 533 may be a transistor M1 which is coupled between the erasing pre-charge voltage Vpre and the erase end point EL of the corresponding memory cell 520, and the transistor M1 is turned on according to the erasing pre-charge enable signal PRENE.

Figure 5C:
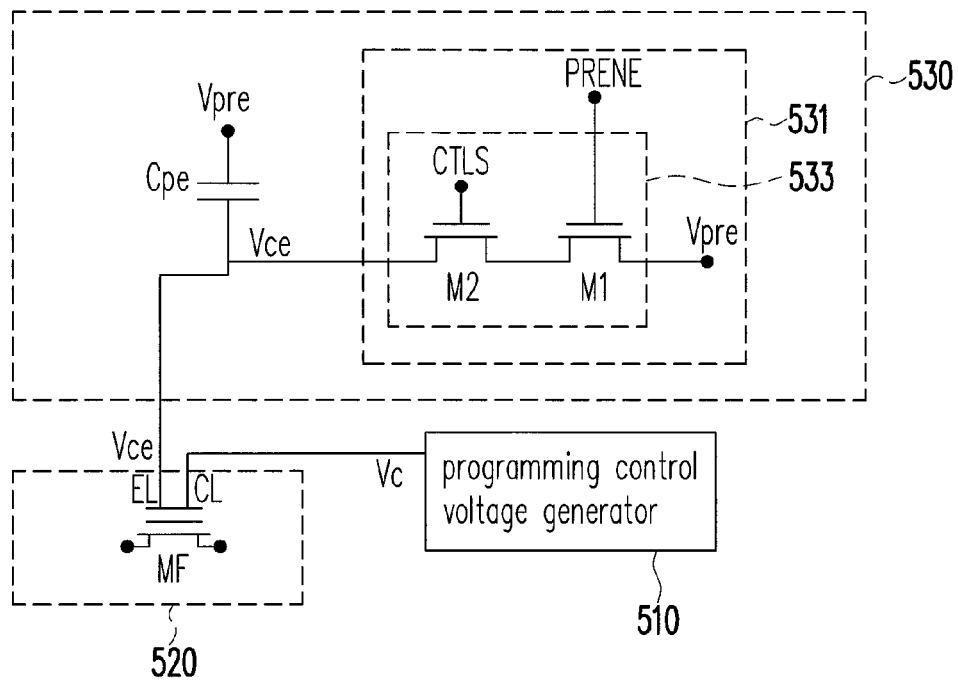

FIG. 5C shows another implementation of the erasing pre-charge voltage transmitter 531 includes the erasing pre-charge switch 533 according to an embodiment of the invention. Please refer to FIG. 5C. the erasing pre-charge switch 533 also may be two transistors M1 and M2 which are coupled in series between the erasing pre-charge voltage Vpre and the erase end point EL of corresponding the memory cell 520, and the transistor M1 and the transistor M2 are enabled according to an erasing pre-charge enable signal PRENE and a control signal CTLS, respectively.

Figure 5D:
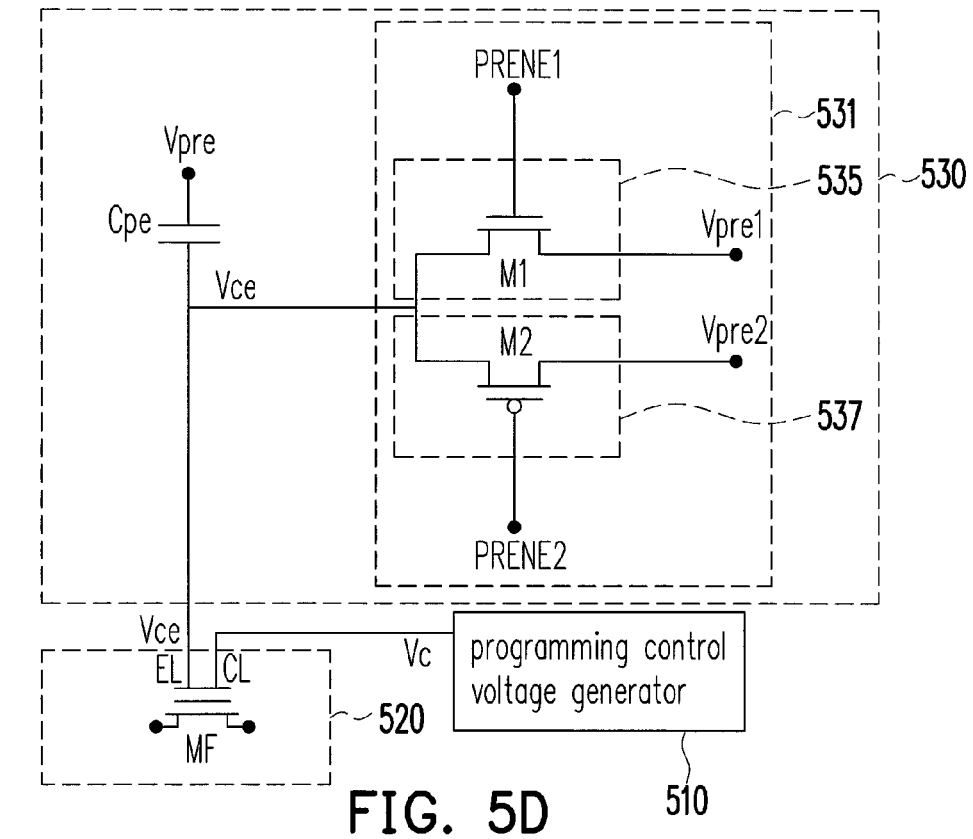

FIG. 5D shows another implementation of the erasing pre-charge voltage transmitter 531 according to an embodiment of the invention. Please refer to FIG. 5D, the erasing pre-charge voltage transmitter 531 includes erasing pre-charge switches 535 and 537. The erasing pre-charge switches 535 and 537 may be transistors M1 and M2 which are respectively coupled between a first erasing pre-charge voltage Vpre1 and the erase end point EL of the corresponding memory cell 520, and between a second erasing pre-charge voltage Vpre2 and the erase end point EL of the corresponding memory cell 520. The erasing pre-charge switches 535 and 537 are operated respectively by applying a first erasing pre-charge enable signal PRENE1 to the transistor M1 or by applying a second erasing pre-charge enable signal PRENE2 to the transistor M2.

Figure 5E:
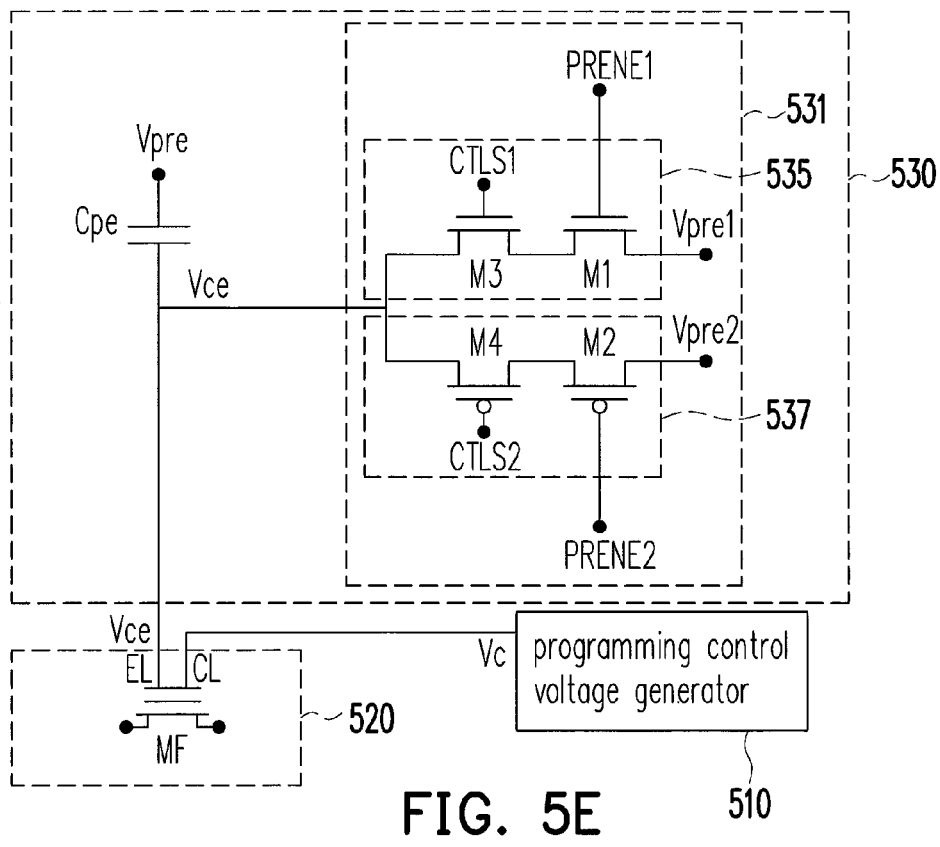

FIG. 5E shows another schematic view of the erasing pre-charge voltage transmitter 531 includes erasing pre-charge switches 535 and 537 according to an embodiment of the invention. Please refer to FIG. 5E. The erasing pre-charge switches 535 and 537 could be implemented respectively through two serially coupled transistors. The erasing pre-charge switch 535 includes transistors M1 and M3 which are coupled in series between a first erasing pre-charge voltage Vpre1 and the erase end point EL of the corresponding memory cell 520, and the erasing pre-charge switch 537 includes transistors M2 and M4 which are coupled in series between a second erasing pre-charge voltage Vpre2 and the erase end point EL of the corresponding memory cell 520. Alternatively, the transistors M1 and M3 are turned on according to a first erasing pre-charge enable signal PRENE1 and a first erasing control signal CTLS1, or the transistors M2 and M4 are turned on according to a second erasing pre-charge enable signal PRENE2 and a second erasing control signal CTLS2. Through the process above, the erasing pre-charge switch 535 and the erasing pre-charge switch 537 are respectively operated.

Figure 6:
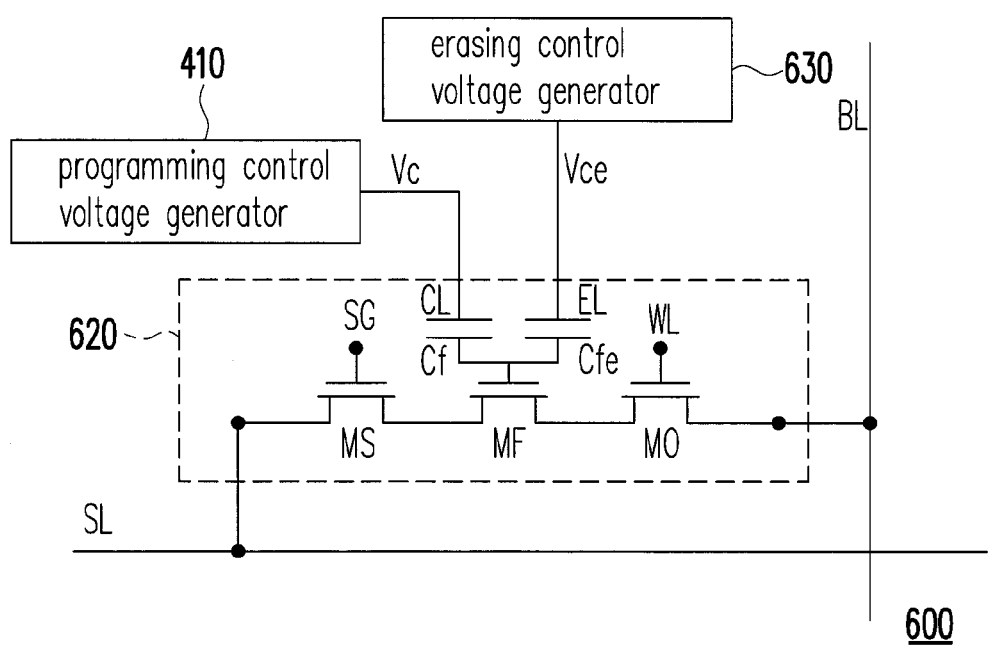
FIG. 6 shows another schematic view of the flash memory apparatus according to an embodiment of the invention.

FIG. 6 shows another schematic view of a flash memory apparatus 600 according to an embodiment of the invention. Please refer to FIG. 6. The embodiment is roughly the same as the embodiment in FIG. 4. The same reference numbers used in FIG. 6 refer to the same or like parts. Comparing to the memory apparatus 400 in FIG. 4, the flash memory apparatus 600 further includes a plurality of memory cells 620 and a plurality of erasing control voltage generators 630. More specifically, each of memory cells 620 coupled between a source line SL and a bit line BL includes a single-poly floating-gate transistor MF, a selecting transistor MS, an operation transistor MO, a gate capacitor Cf and a erase gate capacitor Cfe.

In addition, generally speaking, a block of memory cells could be operated at the same time while being erased. Therefore, the number of the erasing pre-charge voltage transmitters could be reduced through the design of one erasing pre-charge voltage transmitter integrated with a plurality of memory cells.

In summary, the present invention provides a flash memory apparatus. The applied voltage from the exterior of the apparatus is lowered according to the voltage boost operation of the flash memory apparatus so as to reduce the power consumption when the exterior of the apparatus supplying voltages. Additionally, a design of multiple input voltages is offered to enlarge the range of input voltages and the flash memory apparatus is fit to operate under different voltages.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flash memory apparatus, comprising:
    a plurality of memory cells, wherein each of the memory cells receiving a programming control voltage through a control end point, and executing data programming operation according to the programming control voltage; and
    a plurality of programming control voltage generators, coupled to the memory cells respectively, wherein each of the programming control voltage generator comprises:
        a pre-charge voltage transmitter, coupled to the control end point of each of the memory cells, providing a pre-charge voltage to the control end point of corresponding memory cell according to a pre-charge enable signal during a first period of time; and
        a pumping capacitor, coupled between the control end point of each of the memory cells and a pumping voltage which is applied to the pumping capacitor during a second period of time, generating the programming control voltage at the control end point of the corresponding memory cell; and
    a plurality of erasing control voltage generators, respectively coupled to the memory cells, wherein each of the erasing control voltage generators comprises:
        an erasing pre-charge voltage transmitter, coupled to an erase end point of each of memory cells, transmitting an erasing pre-charge voltage to the erase end point of the corresponding memory cell according to an erasing pre-charge enable signal during a third period of time; and
        an erasing pumping capacitor, coupled between the erase end point of each of memory cells and an erasing pumping voltage which is applied to the erasing pumping capacitor during a fourth period of time, generating the erasing control voltage for erasing.

2. The flash memory apparatus as claimed in claim 1, wherein the pre-charge voltage transmitter comprises:
    a pre-charge programming switch, coupled between the pre-charge voltage and the control end point of the corresponding memory cell, which is turned on for transmitting the pre-charge voltage to the control end point according to the pre-charge enable signal.

3. The flash memory apparatus as claimed in claim 2, wherein the pre-charge programming switch comprises:
    a first transistor having a first end, a second end, and a control end, wherein the first end and the second end of the first transistor respectively coupled to the control end point of the corresponding memory cell and the pre-charge voltage, and the control end of the first transistor receiving the pre-charge enable signal.

4. The flash memory apparatus as claimed in claim 3, wherein the pre-charge programming switch further comprises:
    a second transistor, coupled on the path where the first transistor coupled to the control end point of the corresponding memory cell, having a first end, a second end, and a control end, wherein the first end of the second transistor coupled to the control end point of the corresponding memory cell, the second end of the second transistor coupled to the first end of the first transistor, and the control end of the second transistor receiving a control signal.

5. The flash memory apparatus as claimed in claim 1, wherein the pre-charge voltage transmitter comprises:
   a first pre-charge programming switch, coupled between a first pre-charge voltage and the control end point of the corresponding memory cell; and
   a second pre-charge programming switch, coupled between a second pre-charge voltage and the control end point of the corresponding memory cell,
   wherein the first pre-charge programming switch and the second pre-charge programming switch are respectively controlled by a first pre-charge enable signal and a second pre-charge enable signal, and the first pre-charge programming switch transmitting the first pre-charge voltage to the control end point of the corresponding memory cell or the second pre-charge programming switch transmitting the second pre-charge voltage to the control end point of the corresponding memory cell.

6. The flash memory apparatus as claimed in claim 5, wherein the first pre-charge programming switch comprises:
   a first transistor having a first end, a second end, and a control end, wherein the first end and the second end of the first transistor respectively coupled to the control end point of the corresponding memory cell and the first pre-charge voltage, and the control end of the first transistor receiving the first pre-charge enable signal; and
   the second pre-charge programming switch comprises:
   a second transistor having a first end, a second end and a control end, wherein the first end and the second end respectively coupled to the control end point of the corresponding memory cell and the second pre-charge voltage, and the control end of the second transistor receiving the second pre-charge enable signal.

7. The flash memory apparatus as claimed in claim 6, wherein the first pre-charge programming switch further comprises:
   a third transistor, coupled on the path where the first transistor coupled to the control end point of the corresponding memory cell, having a first end, a second end, and a control end, wherein the first end of the third transistor coupled to the control end point of the corresponding memory cell, the second end of the third transistor coupled to the first end of the first transistor, and the control end of the third transistor receiving a first control signal; and
   the second pre-charge programming switch further comprises:
   a fourth transistor, coupled on the path where the second transistor coupled to the control end point of the corresponding memory cell, having a first end, a second end, and a control end, wherein the first end of the fourth transistor coupled to the control end point of the corresponding memory cell, the second end of the fourth transistor coupled to the first end of the second transistor, and the control end of the fourth transistor receiving a second control signal.

8. The flash memory apparatus as claimed in claim 7, wherein the second transistor and the fourth transistor are P-type transistors, and the first transistor and the third transistor are N-type transistors.

9. The flash memory apparatus as claimed in claim 1, wherein each of the memory cells comprises:
   a floating-gate transistor.

10. The memory cell as claimed in claim 9, wherein the floating-gate transistor is fabricated by:
    a single-poly CMOS process.

11. The flash memory apparatus as claimed in claim 1, wherein the memory cell comprises:
    a dielectric storage transistor.

12. The flash memory apparatus as claimed in claim 1, wherein each of the memory cells coupled to a source line and a bit line comprises:
    a storage transistor, having a first end, a second end, and a control end, wherein the first end of the storage transistor coupled to the source line, and the second end of the storage transistor coupled to the bit line;
    a selecting transistor, coupled on the path where the source line coupled to the storage transistor, having a first end, a second end, and a control end, wherein the first end of the selecting transistor coupled to the source line, the second end of the selecting transistor coupled to first end of the storage transistor, and the control end of the selecting transistor receiving a selecting signal;
    an operation transistor, coupled on the path where the bit line coupled to the storage transistor, having a first end, a second end, and a control end, wherein the first end of the operation transistor coupled to the second end of the storage transistor, the second end of the operation transistor coupled to the bit line, and the control end of the operation transistor receiving a word line enable signal; and
    a gate capacitor, coupled between the programming control voltage and the control end of the storage transistor.

13. The memory cell as claimed in claim 12, wherein the storage transistor is:
    a floating-gate transistor.

14. The flash memory apparatus as claimed in claim 1, wherein the erasing pre-charge voltage transmitter comprises:
    an erasing pre-charge switch, coupled between the erasing pre-charge voltage and the erase end point of the corresponding memory cell, which is turned on according to the erasing pre-charge enable signal for transmitting the erasing pre-charge voltage to the erase end point.

15. The flash memory apparatus as claimed in claim 14, wherein the erasing pre-charge switch comprises:
    a first transistor having a first end, a second end, and a control end, wherein the first end and the second end of the first transistor respectively coupled to the erase end point of the corresponding memory cell and the erasing pre-charge voltage, and the control end of the first transistor receiving the erasing pre-charge enable signal.

16. The flash memory apparatus as claimed in claim 15, wherein the erasing pre-charge switch further comprises:
    a second transistor, coupled on the path where the first transistor coupled to the erase end point of the corresponding memory cell, having a first end, a second end, and a control end, wherein the first end of the second transistor coupled to the erase end point of the corresponding memory cell, the second end of the second transistor coupled to the first end of the first transistor, and the control end of the second transistor receiving a control signal.

17. The flash memory apparatus as claimed in claim 1, wherein the erasing pre-charge voltage transmitter comprises:
    a first erasing pre-charge switch, coupled between a first erasing pre-charge voltage and the erase end point of the corresponding memory cell; and
    a second erasing pre-charge switch, coupled between a second erasing pre-charge voltage and the erase end point of the corresponding memory cell, wherein the first erasing pre-charge switch and the second erasing pre-charge switch are respectively controlled by a first erasing pre-charge enable signal and a second erasing pre-charge enable signal, and transmitting the first erasing pre-charge voltage or the second erasing pre-charge voltage to the erase end point of the corresponding memory cell.

18. The flash memory apparatus as claimed in claim 17, wherein the first erasing pre-charge switch comprises:
a first transistor having a first end, a second end, and a control end, wherein the first end and the second end of the first transistor respectively coupled to the erase end point of the corresponding memory cell and the first erasing pre-charge voltage, and the control end of the first programming transistor receiving the first erasing pre-charge enable signal; and
the second erasing pre-charge switch comprises:
a second transistor having a first end, a second end, and a control end, wherein the first end and the second end of the second transistor respectively coupled to the erase end point of the corresponding memory cell and the second erasing pre-charge voltage, and the control end of the second transistor receiving the second erasing pre-charge enable signal.

19. The flash memory apparatus as claimed in claim 18, wherein the first erasing pre-charge switch further comprises:
a third transistor, coupled on the path where the first transistor coupled to the erase end point of the corresponding memory cell, having a first end, a second end, and a control end, wherein the first end of the third transistor coupled to the erase end point of the corresponding memory cell, the second end of the third transistor coupled to the first end of the first transistor, and the control end of the third transistor receiving a first erasing control signal; and
the second erasing pre-charge switch further comprises:
a fourth transistor, coupled on the path where the second transistor coupled to the erase end point of the corresponding memory cell, having a first end, a second end, and a control end, wherein the first end of the fourth transistor coupled to the erase end point of the corresponding memory cell, the second end of the fourth transistor coupled to the first end of the second transistor, and the control end of the fourth transistor receiving a second erasing control signal.

20. The flash memory apparatus as claimed in claim 19, wherein the second transistor and the fourth transistor are P-type transistors, and the first transistor and the third transistor are N-type transistors.

21. The flash memory apparatus as claimed in claim 1, wherein each of the memory cells coupled to a source line and a bit line comprises:
a storage transistor, having a first end, a second end, and a control end, wherein the first end of the storage transistor coupled to the source line, and the second end of the storage transistor coupled to the bit line;
a selecting transistor, coupled on the path where the source line coupled to the storage transistor, having a first end, a second end, and a control end, wherein the first end of the selecting transistor coupled to the source line, the second end of the selecting transistor coupled to first end of the storage transistor, and the control end of the selecting transistor receiving a selecting signal;
an operation transistor, coupled on the path where the bit line coupled to the storage transistor, having a first end, a second end, and a control end, wherein the first end of the operation transistor coupled to the second end of the storage transistor, the second end of the operation transistor coupled to the bit line, and the control end of the operation transistor receiving a word line enable signal; and
a gate capacitor, coupled between the programming control voltage and the control end of the storage transistor.

* * * * *